(12) United States Patent
Lee

(10) Patent No.: US 6,835,620 B1
(45) Date of Patent: Dec. 28, 2004

(54) METHOD OF MANUFACTURING FLASH MEMORY DEVICES

(75) Inventor: Sung Hoon Lee, Seoul (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 0 days.

(21) Appl. No.: 10/881,461

(22) Filed: Jun. 30, 2004

(30) Foreign Application Priority Data

Sep. 5, 2003 (KR) ................................ 10-2003-0062073

(51) Int. Cl.⁷ .......................................... H01L 21/8247
(52) U.S. Cl. ...................................... 438/257; 438/466
(58) Field of Search ................................ 438/257–267, 438/466

(56) References Cited

U.S. PATENT DOCUMENTS 5,599,727 A * 2/1997 Hakozaki et al. ............ 438/261
2002/0168820 A1 * 11/2002 Kozicki et al. .............. 438/261

\* cited by examiner

*Primary Examiner*—Richard A. Booth
(74) *Attorney, Agent, or Firm*—Marshall, Gerstein & Borun LLP

(57) ABSTRACT

Disclosed is a method of manufacturing flash memory devices. According to the present invention, the method comprises the steps of sequentially forming a gate oxide film, a first polysilicon film for a floating gate electrode and a pad nitride film on a semiconductor substrate, patterning the gate oxide film, the first polysilicon film, the pad nitride film and the semiconductor substrate by a given thickness to form an isolation film pattern and a floating gate electrode pattern at the same time, filling the isolation film pattern with an insulating film to form an isolation film and then stripping the pad nitride film, sequentially forming a dielectric film, a second polysilicon film for a control gate electrode and a metal silicide film on the results, patterning the metal silicide film and the second polysilicon film to form a control gate electrode pattern, performing an electrochemical process for the results, whereby the first polysilicon film formed in regions other than the region where the second polysilicon film formed on the isolation film and the floating gate electrode pattern are formed becomes a porous silicon film, performing a thermal oxidization process for the results so that the porous silicon film becomes a first oxide film, and forming a second oxide film on the whole results.

7 Claims, 6 Drawing Sheets

METHOD OF MANUFACTURING FLASH MEMORY DEVICES

BACKGROUND

1. Field of the Invention

The present invention relates to a method of manufacturing semiconductor devices, and more specifically, to a method of manufacturing flash memory devices.

2. Discussion of Related Art

A method of forming a gate electrode in a flash memory device is classified into a method of forming a floating gate electrode and a method of forming a control gate electrode. In order to satisfy the coupling ratio of the floating gate electrode, the surface area of a first polysilicon film becoming the floating gate electrode has to be increased. At this time, the method of increasing the surface area of the first polysilicon film includes a method of increasing a width of the first polysilicon film and a method of increasing a thickness of the first polysilicon film. Conventionally, the method of increasing the width of the first polysilicon film ("a" in FIG. 1) is usually used.

If the width of the first polysilicon film increases, however, a space between an active region and an active region must be increased. Therefore, there is a problem that the width of an isolation film formed in an inactive region increases to increase the cell size.

In this connection, there is a need for technology for forming a first polysilicon film for use in a floating gate electrode capable of reducing the cell size while satisfying the coupling ratio of the floating gate electrode.

SUMMARY OF THE INVENTION

Accordingly, the present invention has been made in view of the above problems, and it is an object of the present invention to provide a method of manufacturing flash memory devices wherein a first polysilicon film for use in a floating gate electrode, which can reduce the cell size while satisfying the coupling ratio of the floating gate electrode, is formed.

In order to accomplish the above object, according to a preferred embodiment of the present invention, there is provided a method of manufacturing flash memory devices, comprising the steps of: sequentially forming a gate oxide film, a first polysilicon film for a floating gate electrode and a pad nitride film on a semiconductor substrate; patterning the gate oxide film, the first polysilicon film, the pad nitride film and the semiconductor substrate by a given thickness to form an isolation film pattern and a floating gate electrode pattern at the same time; filling the isolation film pattern with an insulating film to form an isolation film and then stripping the pad nitride film; sequentially forming a dielectric film, a second polysilicon film for a control gate electrode and a metal silicide film on the results; patterning the metal silicide film and the second polysilicon film to form a control gate electrode pattern; performing an electrochemical process for the results, whereby the first polysilicon film formed in regions other than the region where the second polysilicon film formed on the isolation film and the floating gate electrode pattern are formed becomes a porous silicon film; performing a thermal oxidization process for the results so that the porous silicon film becomes a first oxide film; and forming a second oxide film on the whole results.

It is preferred that the first polysilicon film in which the porous silicon film is formed is a film formed between the floating gate electrode patterns.

It is preferable that the second oxide film is a film for insulation between the control gate electrode patterns.

The electrochemical process is preferably performed in a state where the semiconductor substrate formed up to the control gate electrode is mounted in a working cell.

It is preferred that the working cell comprises a reference electrode and a relative electrode that are spaced from the semiconductor substrate by a given distance, ultraviolet rays illuminated on the semiconductor substrate, and an electrolyte solution that is filled into the working cell so that given regions of the reference electrode and the relative electrode are immersed.

The thermal oxidization process preferably includes performing a wet oxidization process under $H_2$ and $O_2$ gas atmosphere in a temperature range of about 700 to 900° C.

It is preferable that the first polysilicon film is formed in thickness of about 1350 Å.

BRIEF DESCRIPTION OF THE DRAWINGS

FIG. 3A to FIG. 7A are cross-sectional views of the flash memory device taken along lines A-A' in FIG. 1 for explaining a method of manufacturing flash memory devices; and FIG. 3B to FIG. 7B are cross-sectional views of the flash memory device taken along lines B-B' in FIG. 1 for explaining the method of manufacturing the flash memory devices.

DETAILED DESCRIPTION OF PREFERRED EMBODIMENTS

Figure 1:
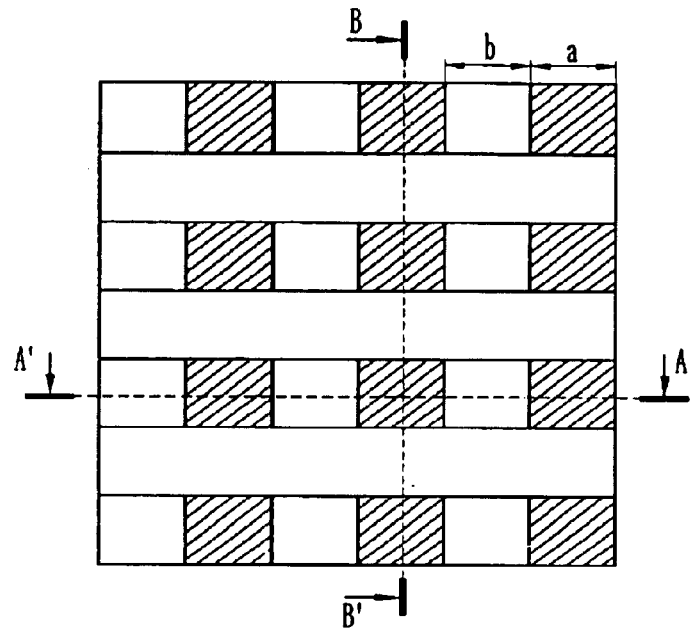
FIG. 1 is a layout diagram showing a conventional flash memory device.

Now the preferred embodiments according to the present invention will be described with reference to the accompanying drawings. Since preferred embodiments are provided for the purpose that the ordinary skilled in the art are able to understand the present invention, they may be modified in various manners and the scope of the present invention is not limited by the preferred embodiments described later.

Meanwhile, in case where it is described that one film is "on" the other film or a semiconductor substrate, the one film may directly contact the other film or the semiconductor substrate. Or, a third film may be intervened between the one film and the other film or the semiconductor substrate. Further, in the drawing, the thickness and size of each layer are exaggerated for convenience of explanation and clarity. Like reference numerals are used to identify the same or similar parts.

Figure 2:
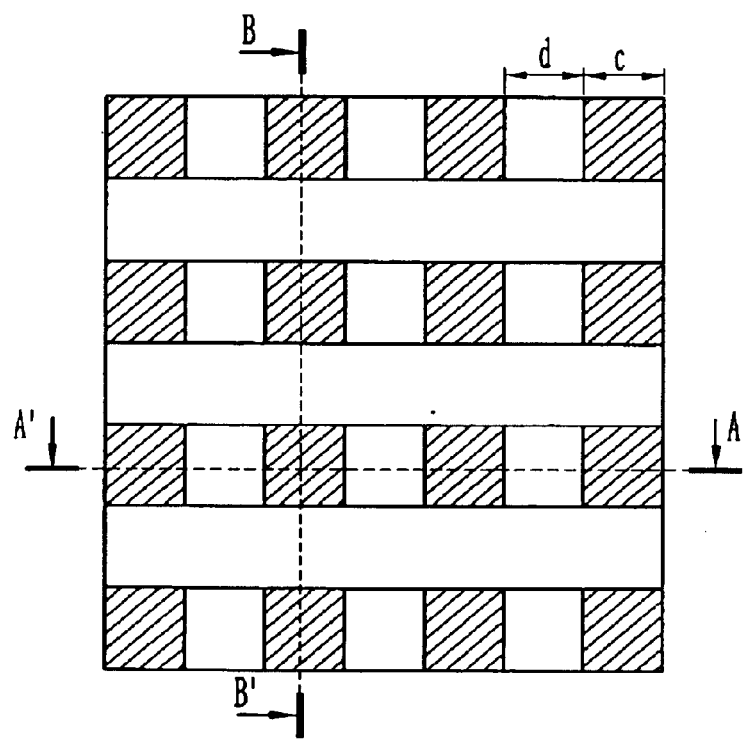
FIG. 2 is a layout diagram showing a flash memory device according to the present invention.

FIG. 2 is a layout diagram showing a flash memory device according to the present invention, FIG. 3A to FIG. 7A are cross-sectional views of the flash memory device taken along lines A-A' in FIG. 1 for explaining a method of manufacturing flash memory devices, and FIG. 3B to FIG. 7B are cross-sectional views of the flash memory device taken along lines B-B' in FIG. 1 for explaining the method of manufacturing the flash memory devices.

Figure 3A:
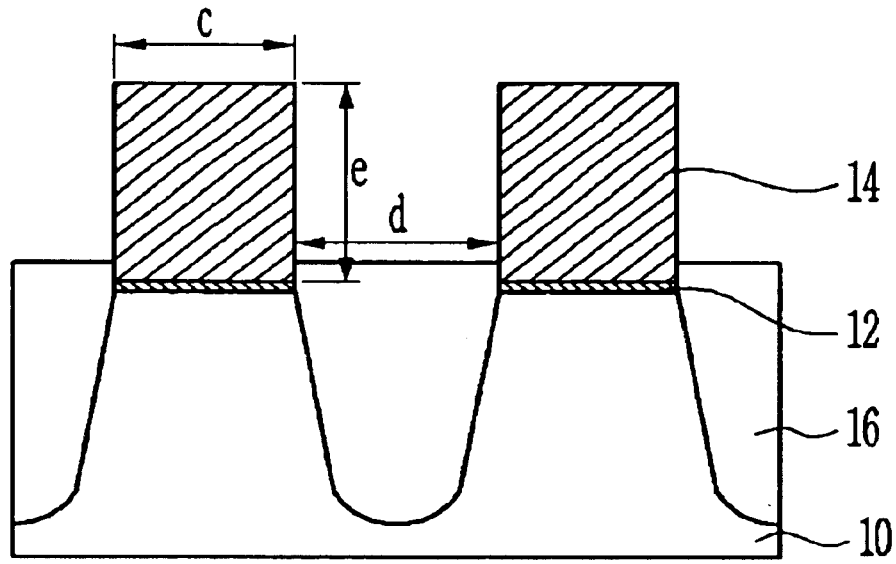
Figure 3B:
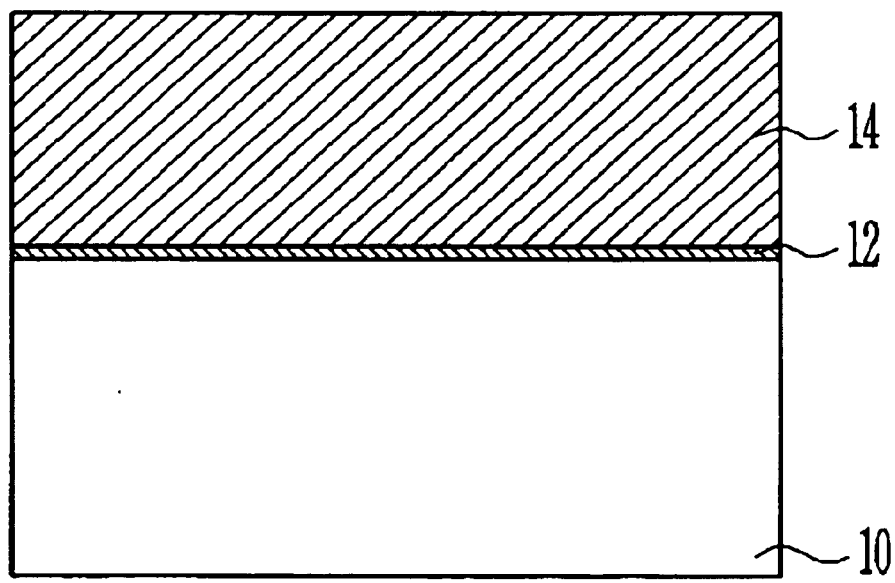

Referring to FIG. 3A and FIG. 3B, a gate oxide film 12, a first polysilicon film 14 for a floating gate electrode and a pad nitride film (not shown) are sequentially formed on a semiconductor substrate 10 of a silicon material. A photoresist pattern (not shown) is formed in a predetermined region on the pad nitride film (not shown). Each of the pad nitride film (not shown), the first polysilicon film 14, the gate oxide film 12 and the semiconductor substrate 10 is etched in a given thickness using the photoresist pattern as an etch mask, thus forming an isolation film pattern in an inactive region and a floating gate electrode pattern in an active region at the same time.

Meanwhile, if a width of a conventional isolation film pattern is (a width of the inactive region, "b" in FIG. 1) is 120 nm, a width of the first polysilicon film of the floating gate electrode pattern (a width of the active region, "a" in FIG. 1) is 90 nm. That is, the pitch size is 210 nm. In the present invention, a width of the isolation film pattern ("d" in FIG. 3A) and a width of the first polysilicon film of the floating gate electrode pattern ("c" in FIG. 3A) can be made same 90 nm. Since the pitch size can be reduced to 180 nm, the cell size is reduced.

Furthermore, a thickness of the first polysilicon film becoming the floating gate electrode pattern is conventionally 1000 Å, whereas a thickness of the first polysilicon film 14 becoming the floating gate electrode pattern ("e" in FIG. 3A) in the present invention is about 1350 Å. Although the prior art and the present invention have the first polysilicon film of the same width, the first polysilicon film according to the present invention is thicker than that of the prior art. As a result, the surface area of the first polysilicon film according to the present invention is more increased than in the prior art. The present invention has the coupling ratio better than the prior art.

Next, an oxidization process is performed for the results, thus forming a sidewall oxide film (not shown) for protecting the sidewall of the isolation film pattern. The isolation film pattern is then filled with oxide material such as a HDP oxide film to form an isolation film 16. The remaining pad nitride film (not shown) is then stripped.

Figure 4A:
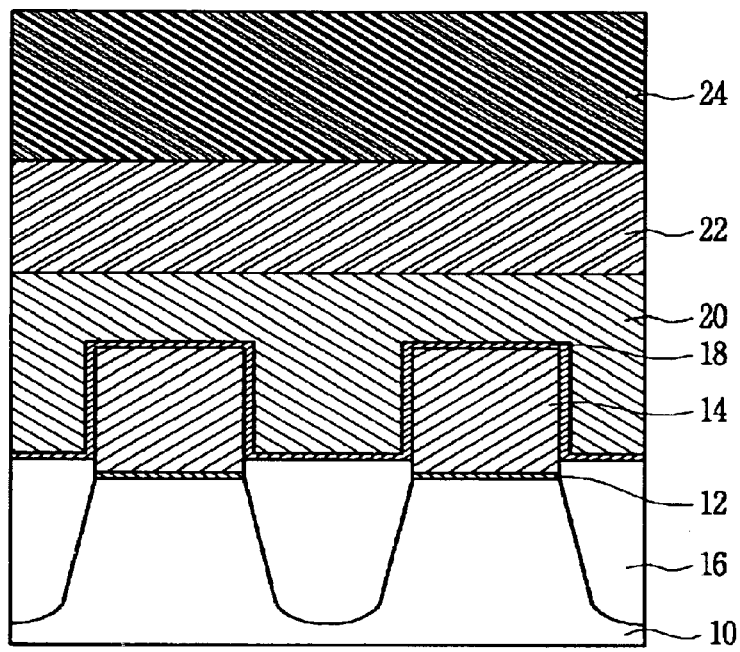
Figure 4B:
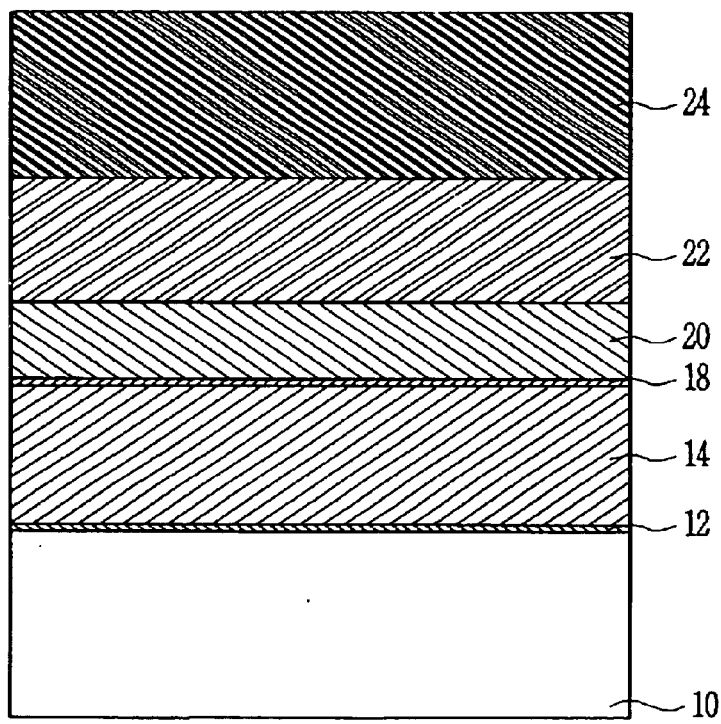

Referring to FIG. 4A and FIG. 4B, an ONO dielectric film 18, a second polysilicon film 20 for a control gate electrode, a tungsten silicide film 22 and a nitride film 24 are sequentially formed on the results in which the isolation film 16 is formed.

Figure 5A:
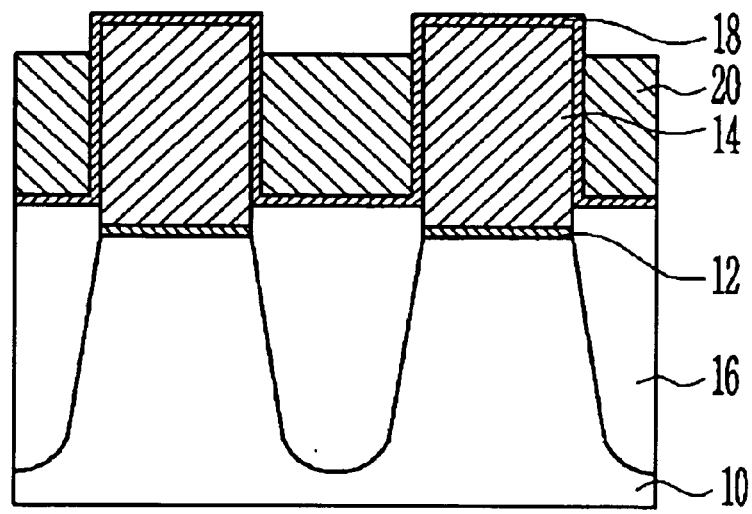
Figure 5B:
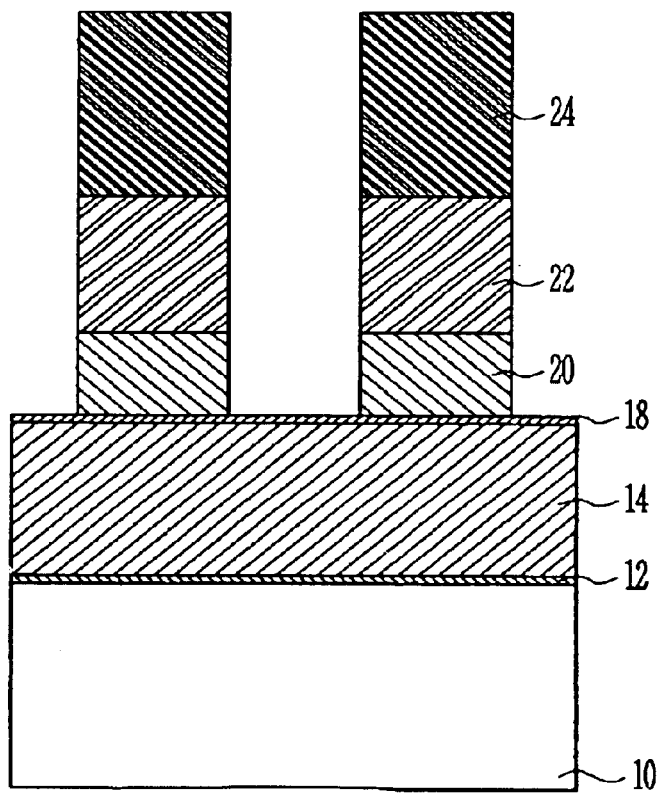

By reference to FIG. 5A and FIG. 5B, a photoresist pattern (not shown) is formed in a predetermined region of the nitride film 24. The nitride film 24, the tungsten silicide film 22 and the second polysilicon film 20 are etched using the photoresist pattern as an etch mask, thereby forming a control gate electrode pattern.

Figure 6A:
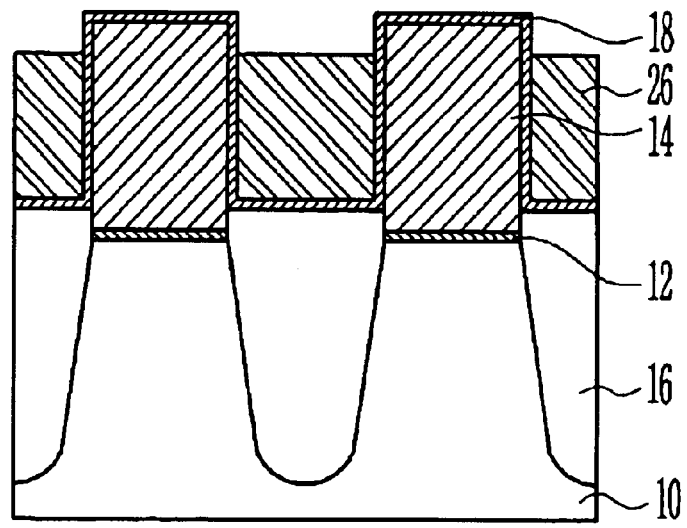
Figure 6B:
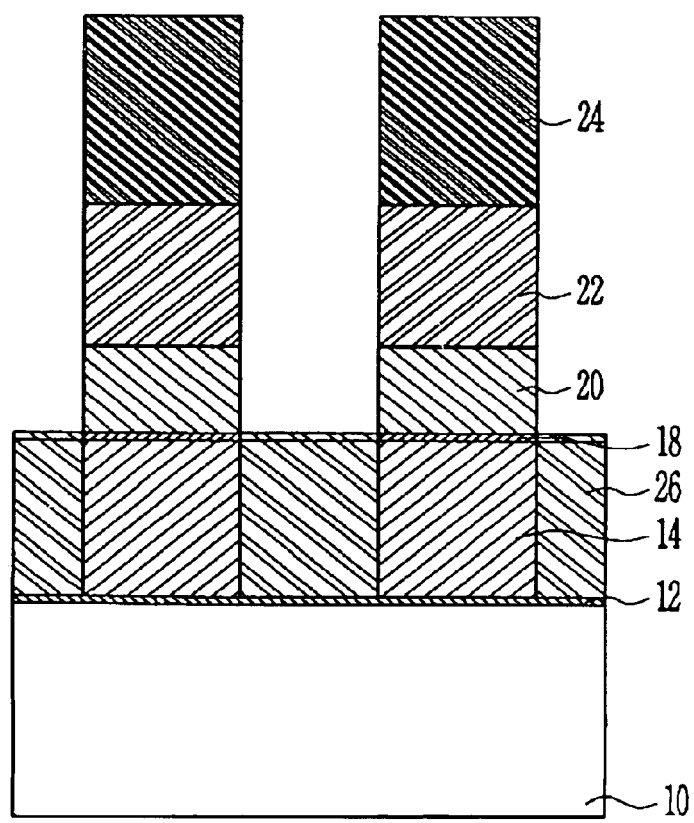

With reference to FIG. 6A and FIG. 6B, an electrochemical process is performed for the results, so that the second polysilicon film 20 located on the isolation film 16 and the first polysilicon film 14 except for the first polysilicon film formed in the floating gate electrode pattern become a porous silicon film 26.

Meanwhile, the electrochemical process is selectively performed for the isolation film 16 and the gate oxide film 12. The two films 12 and 16 serve as stop layers for the progress of the electrochemical process.

Meanwhile, the electrochemical process is a process of making the polysilicon film becoming a porous silicon film. This process is performed in a state where the semiconductor substrate formed up to the control gate electrode is mounted in a working cell for which the electrochemical process will be performed.

The working cell allows a palladium electrode being a relative electrode and a hydrogen standard electrode being a reference electrode to be immersed into electrolyte in a state where the palladium electrode and the hydrogen standard electrode is kept from the semiconductor substrate by a predetermined distance and a voltage to be applied to the rear of the semiconductor substrate.

The electrolyte includes a solution in which HF and ethanol are mixed in a given volume. The ultraviolet rays are illuminated on the working cell.

Therefore, the polysilicon film becomes the porous silicon film by means of the electrochemical process performed in the working cell.

Figure 7A:
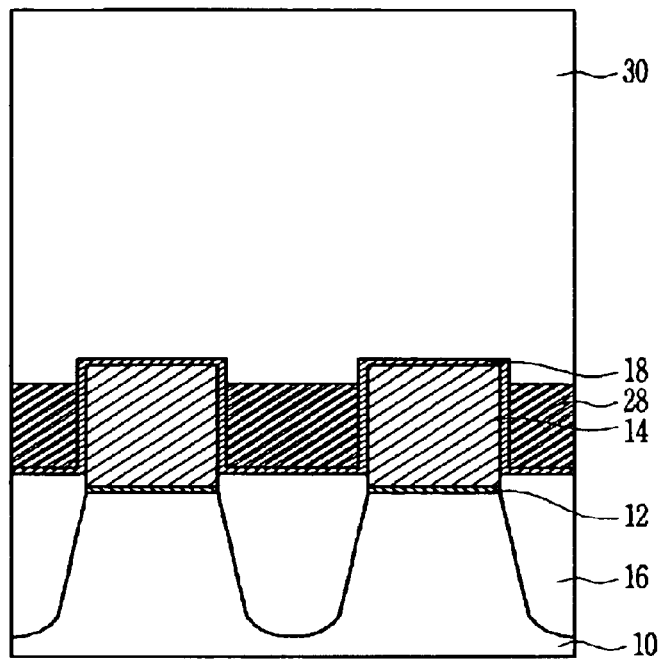
Figure 7B:
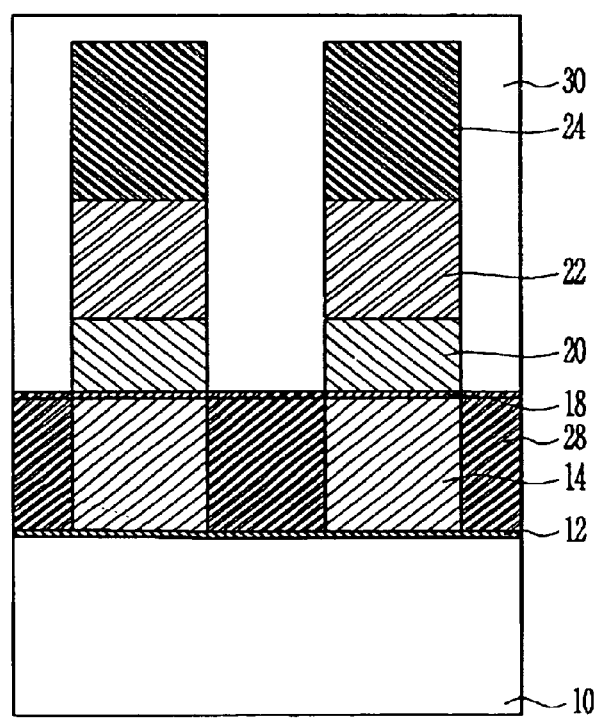

Referring to FIG. 7A and FIG. 7B, a thermal oxidization process is performed for the porous silicon film 26 formed by the electrochemical process, thereby making the porous silicon film 26 a first oxide film 28. The thermal oxidization process includes performing a wet oxidization process under $H_2$ and $O_2$ gas atmosphere in a temperature range of about 700 to 900° C. The first oxide film 28 becomes an insulating film for insulation between the floating gate electrode patterns. Thereafter, a second oxide film 30 is formed on the whole results, thereby completing the process. The second oxide film 30 becomes an insulating film for insulation between the control gate electrode patterns.

Meanwhile, the control gate electrode pattern and the floating gate electrode pattern are formed even in peripheral regions being regions other than the cell region in which the control gate electrode pattern and the floating gate electrode pattern are formed. A process of etching back the second oxide film and the first oxide film to form a spacer at the sidewall of the electrode pattern can be further performed. At this time, at the time of the etch-back process for forming the spacer, it is possible to prevent the second oxide film from being over-etched due to the nitride film 24 when the first oxide film 28 and the second oxide film 30 are etched.

According to the present invention as described above, the surface area of a floating gate electrode is increased by increasing a thickness of a first polysilicon film for a floating gate electrode. It is thus possible to reduce the cell size while satisfying the coupling ratio of the floating gate electrode.

Furthermore, a first polysilicon film having an increased thickness, which is formed between floating gate electrodes, becomes an oxide film for insulation through an electrochemical process and thermal oxidization process. A short circuit is thus prevented in an area between patterns for narrow floating gate electrodes. It is therefore possible to secure an increased area of a floating gate electrode. Accordingly, the present invention has effects that it can reduce the cell size while reducing the coupling ratio of a floating gate electrode.

Although the foregoing description has been made with reference to the preferred embodiments, it is to be understood that changes and modifications of the present invention may be made by the ordinary skilled in the art without departing from the spirit and scope of the present invention and appended claims.

What is claimed is:

1. A method of manufacturing flash memory devices, comprising the steps of:

sequentially forming a gate oxide film, a first polysilicon film for a floating gate electrode and a pad nitride film on a semiconductor substrate;

patterning the gate oxide film, the first polysilicon film, the pad nitride film and the semiconductor substrate in a given thickness to form an isolation film pattern and a floating gate electrode pattern at the same time;

filling the isolation film pattern with an insulating film to form an isolation film and then stripping the pad nitride film;

sequentially forming a dielectric film, a second polysilicon film for a control gate electrode and a metal silicide film on the resulting structure;

patterning the metal silicide film and the second polysilicon film to form a control gate electrode pattern;

performing an electrochemical process for the resulting structure, whereby the first polysilicon film formed in regions other than the region where the second polysilicon film is formed on the isolation film and the floating gate electrode pattern is formed becomes a porous silicon film;

performing a thermal oxidation process for the resulting structure so that the porous silicon film becomes a first oxide film; and forming a second oxide film on the whole resulting structure.

2. The method as claimed in claim 1, wherein the first polysilicon film having the porous silicon film formed therein is a film formed between the floating gate electrode patterns.

3. The method as claimed in claim 1, wherein the second oxide film is a film for insulation between the control gate electrode patterns.

4. The method as claimed in claim 1, wherein the electrochemical process is performed in a state where the semiconductor substrate formed up to the control gate electrode is mounted in a working cell.

5. The method as claimed in claim 4, wherein the working cell comprises:

a reference electrode and a relative electrode that are spaced from the semiconductor substrate by a given distance;

ultraviolet rays illuminated on the semiconductor substrate; and an electrolyte solution that is filled into the working cell so that given regions of the reference electrode and the relative electrode are immersed.

6. The method as claimed in claim 1, wherein the thermal oxidization process includes performing a wet oxidization process under $H_2$ and $O_2$ gas atmosphere in a temperature range of about 700 to 900° C.

7. The method as claimed in claim 1, wherein the first polysilicon film is formed with a thickness of about 1350 Å.

\* \* \* \* \*